(12) United States Patent
Nakagawa et al.

(10) Patent No.: US 7,274,615 B2
(45) Date of Patent: Sep. 25, 2007

(54) SEMICONDUCTOR MEMORY DEVICE AND SEMICONDUCTOR MEMORY DEVICE TEST METHOD

(75) Inventors: Hiroshi Nakagawa, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 15 days.

(21) Appl. No.: 11/376,297

(22) Filed: Mar. 16, 2006

(65) Prior Publication Data

US 2006/0227643 A1   Oct. 12, 2006

(30) Foreign Application Priority Data

Mar. 24, 2005   (JP)   ............................. 2005-086175

(51) Int. Cl.
*G11C 17/18*   (2006.01)
(52) U.S. Cl. .................... 365/225.7; 365/200; 365/201
(58) Field of Classification Search ............. 365/225.7, 365/200, 201
See application file for complete search history.

(56) References Cited

U.S. PATENT DOCUMENTS 6,392,937 B2 * 5/2002 Nagai ......................... 365/200

2004/0085826 A1 * 5/2004 Sakata et al. ............... 365/200

FOREIGN PATENT DOCUMENTS

JP   2000-90689    3/2000
JP   2000-331495   11/2000

* cited by examiner

*Primary Examiner*—Richard T. Elms
*Assistant Examiner*—Toan Le
(74) *Attorney, Agent, or Firm*—Whitham Curtis Christofferson & Cook, PC

(57) ABSTRACT

During writing of fail addresses to address registers, when writing of a number of fail addresses that is greater than the number of antifuses that have been provided in advance is about to be executed, or when a storage process of a number of fail addresses that is greater than the number of antifuses that have been provided in advance is about to be executed, delivering as output an overflow signal indicating that the writing or storage operation cannot be executed and reporting to the outside that remedy of defects by antifuses is no longer possible.

12 Claims, 9 Drawing Sheets

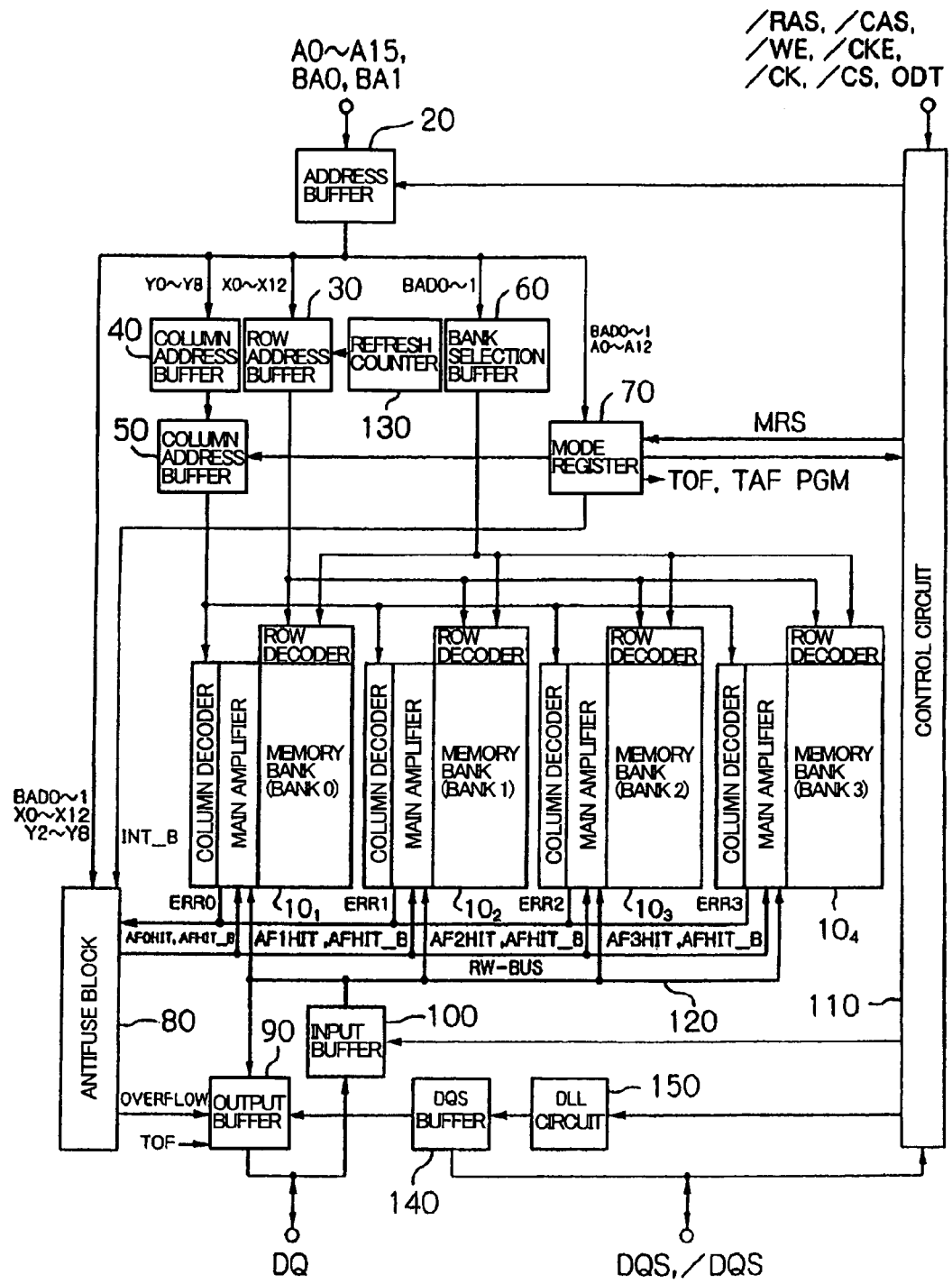
F I G. 1

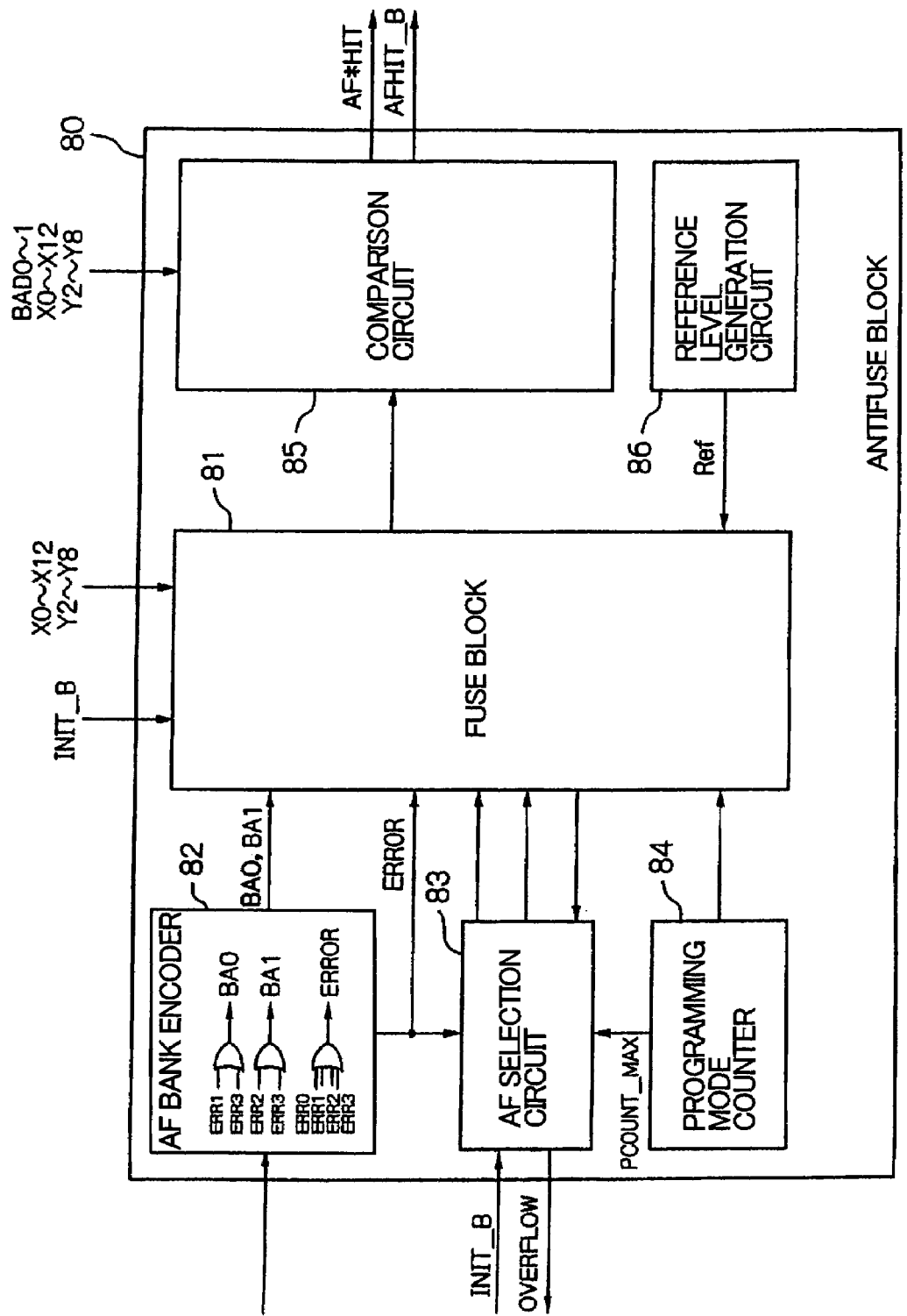
F I G. 3

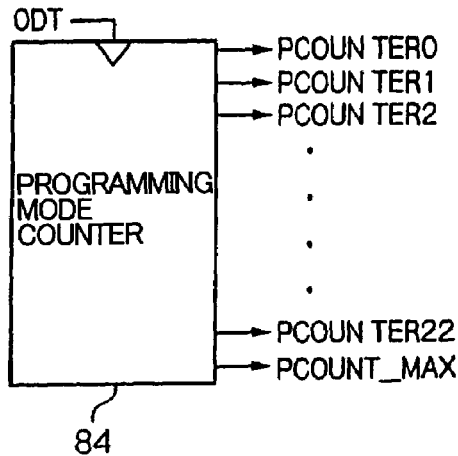
F I G. 7
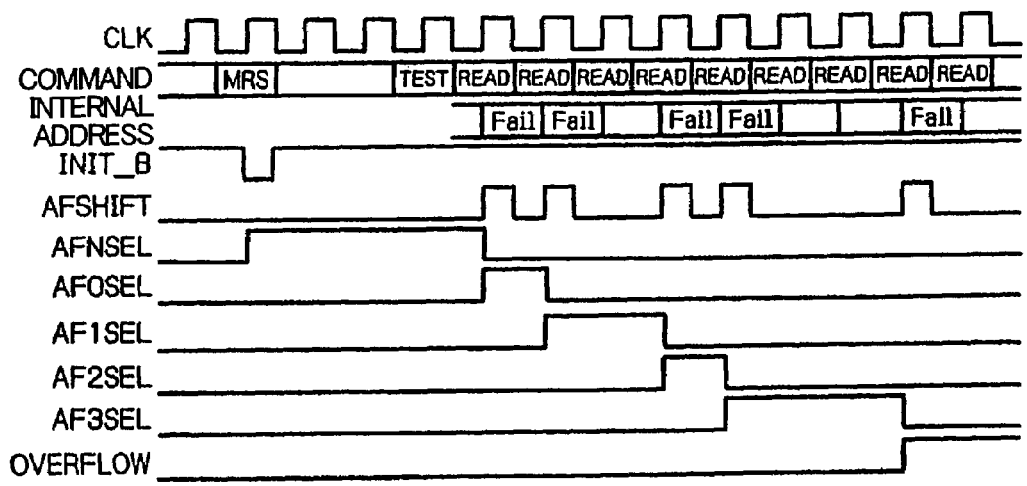
F I G. 8

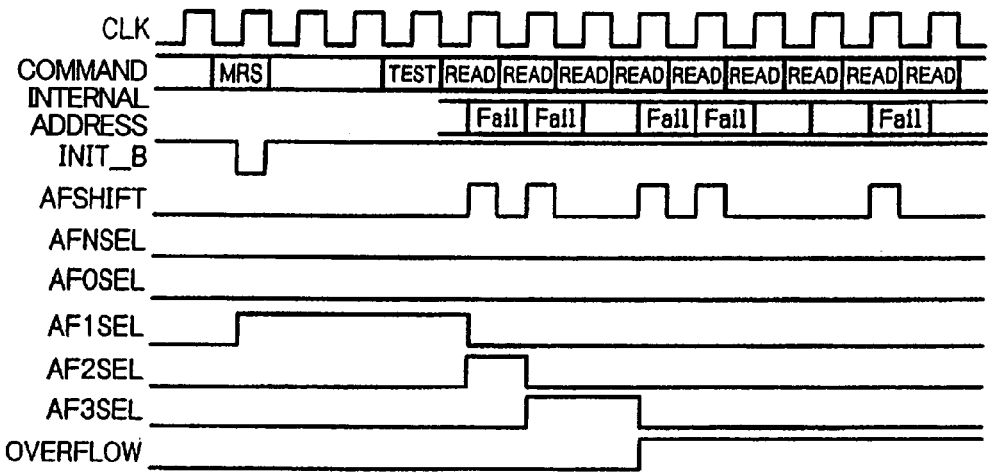
F I G. 9
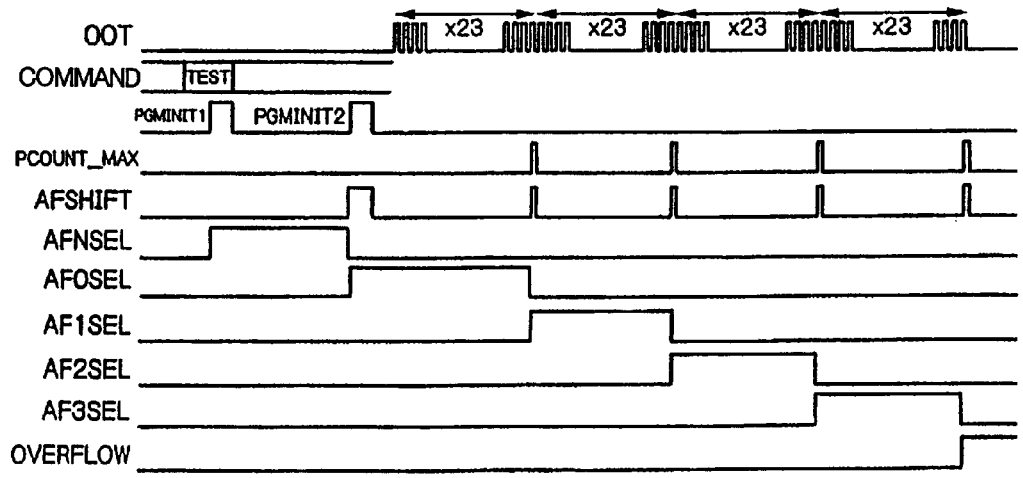
F I G. 10

SEMICONDUCTOR MEMORY DEVICE AND SEMICONDUCTOR MEMORY DEVICE TEST METHOD

BACKGROUND OF THE INVENTION

1. Field of the Invention

The present invention relates to a semiconductor memory device that is provided with antifuses that are used in remedying memory cells in which defects have been found, and to a test method for this semiconductor memory device.

2. Description of the Related Art

In semiconductor memory devices in recent years, the miniaturization of memory cells and peripheral circuits that has accompanied the great increase in memory capacity has brought with it an increase in the incidence of defective parts that are unintentionally incorporated. Semiconductor memory device are therefore provided with both normal memory cells, which are memory cells for normal use, and redundant memory cells, which substitute when a defect occurs in a normal memory cell; and the defect remedy technology for replacing normal memory cells in which defects have been detected (hereinbelow referred to as "defective memory cells") with redundant memory cells to improve product yield has become a crucial technology.

In order to replace a defective memory cell with a redundant memory cell, the address of the defective memory cell (hereinbelow referred to as "fail address") must be stored. Nonvolatile memory elements for storing fail addresses include fuses in which a conductor is fused and insulated by a laser or electric current, and antifuses in which an overvoltage is applied to an insulator to break down the insulator to cause conduction.

In fuses that are typically used as in semiconductor memory devices of the prior art, a laser light is used when testing the memory chip to fuse conductors and thus store fail addresses, and as memory elements, these fuses have relatively stable characteristics. However, a method in which a laser is used to melt a fuse and store fail addresses suffers from the problem that, once a memory chip has been sealed within a package (assembled), defects that are detected can no longer be remedied, and this method is therefore unable to adequately improve product yield. In recent years, however, antifuses are coming into use that are capable of remedying defective memory cells even after assembly.

As a typical method for storing fail addresses in an antifuse, fail addresses are first stored to an internal register (hereinbelow referred to as an "address register") that is provided in the semiconductor memory device, following which antifuses are short-circuited (hereinbelow referred to as "programmed") in accordance with fail addresses that have been stored in the address register. Methods for storing fail addresses in the address register include a method in which, each time a defect is detected during a test of memory cells, the fail address is written to the address register inside the semiconductor memory device; and a method in which a known memory test is used to detect fail addresses in advance, and the detected fail addresses then written to the address register from the outside.

As a typical method for programming antifuses, the semiconductor memory device is switched to the programming mode, and voltage pulses for breaking down insulation are supplied to the antifuses.

An example of a configuration for detecting the state of antifuses following programming for improving the efficiency of the programming step is described in JP-A-2000-90689.

Of the above-described methods for storing fail addresses in address registers, the method in which fail addresses are written to the address registers inside the semiconductor memory device each time a defect is detected lacks a means for checking whether the number of detected fail addresses is greater than the number of antifuses that are provided in the semiconductor memory device, and as a result, the inability to remedy defective memory cells is not discovered until the test step that follows completion of programming of antifuses. As a result, there is the problem that pointless tests are applied to semiconductor memory devices in which defective memory cells cannot be remedied.

In the method in which fail addresses that have been detected in advance are written to the address register from the outside, moreover, as previously described, a known memory tester is used to detect fail addresses in advance, the detected fail addresses are written to the address register from the outside, and the antifuses then programmed, following which a test step is performed to verify whether defective memory cells have been remedied or not. As a result, there is the problem of inconvenience in the remedy routine for remedying defective memory cells.

In addition, when a defect remedy process using antifuses is carried out a plurality of times, such as when a defect remedy process is carried out for a memory chip by itself, and then for the memory chip after it has been sealed in a package, the remaining antifuses that have not been programmed in the previous defect remedy processes must be verified. However, the problem arises that when the remaining antifuses cannot be verified, the same programming process is repeated in the second and succeeding defect remedy processes for already programmed antifuses, resulting in an unnecessarily lengthy defect remedy process.

SUMMARY OF THE INVENTION

It is an object of the present invention to provide a semiconductor memory device that enables a shortening of the time required for both a defect remedy process that uses antifuses and the associated test process, and to provide the associated test method.

In the present invention for achieving the above-described object, during the writing of fail addresses at which defects have been detected to an address register, when a process is to be executed for writing a number of fail addresses that is greater than the number of incorporated antifuses, an overflow signal is delivered indicating that writing cannot be executed.

Alternatively, during the storage of fail addresses in antifuses, when a process is to be executed for storing a number of fail addresses that is greater than the number of antifuses that have been provided beforehand, an overflow signal is delivered to indicate that the storage process cannot be executed.

By means of these expedients, the monitoring of overflow signals enables easy verification from the outside of the inability to remedy defects using antifuses.

Accordingly, a test can be terminated upon detection of an overflow signal, whereby a saving of time can be realized for both the defect remedy process that uses antifuses as well as the test process.

The above and other objects, features, and advantages of the present invention will become apparent from the following description with reference to the accompanying drawings which illustrate examples of the present invention.

BRIEF DESCRIPTION OF THE DRAWINGS

FIG. 1 is a block diagram showing an example of the configuration of a semiconductor memory device according to the present invention;

FIG. 3 is a block diagram showing an example of the configuration of the antifuse block shown in FIG. 1;

FIG. 7 is a circuit diagram showing an example of the configuration of the program mode counter shown in FIG. 3;

FIG. 8 is a timing chart showing the operation during writing of fail addresses to an address register when there are no sets of used antifuses;

FIG. 9 is a timing chart showing the operation during writing of fail addresses to an address register when there are two sets of used antifuses;

FIG. 10 is a timing chart showing the operation during programming of antifuses when there are no sets of used antifuses.

DETAILED DESCRIPTION OF THE PREFERRED EMBODIMENTS

Figure 2:
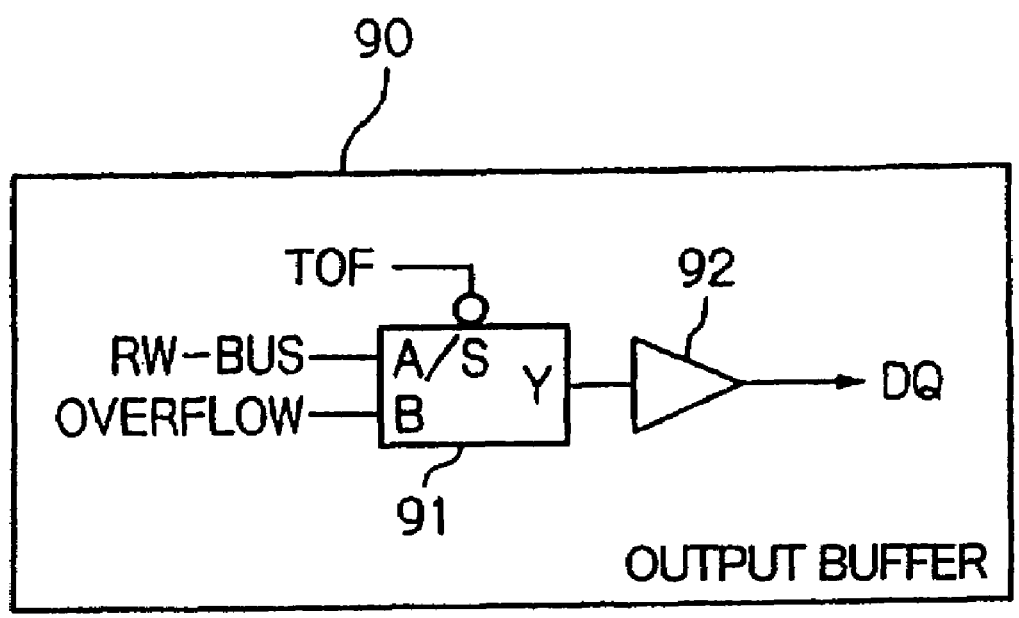
FIG. 2 is a circuit diagram showing an example of the configuration of the output buffer shown in FIG. 1.

During writing of fail addresses of defects that have been detected to address registers in the semiconductor memory device of the present invention, when a number of fail addresses about to be written is greater than the number of incorporated antifuses, an overflow signal is supplied from, for example, the DQ terminal, which is the outside input/output terminal for data.

During programming of antifuses, an overflow signal is supplied from the DQ terminal when the number of instances of programming that is about to be executed is greater than the number of instances of programming of all antifuses. This type of overflow signal is used to report to the outside that defect remedy by means of antifuses is no longer possible.

As shown in FIG. 1, the semiconductor memory device of the present invention is of a configuration that includes: a plurality of memory banks 10 ($10_1$-$10_4$ in FIG. 1) each composed of a memory cell array that can be independently accessed; address buffer 20 that receives as input from the outside address signals A0-A15 and bank selection signals BA0 and BA1 for selecting memory bank 10 that is to be accessed and that generates row addresses X0-X12 and column addresses Y0-Y8 from address signals A0-A15; row address buffer 30 for temporarily holding row addresses X0-X12 that have been delivered from address buffer 20 and supplying row addresses X0-X12 to each memory bank 10; column address buffer 40 for temporarily holding column addresses Y0-Y8 delivered from address buffer 20; column address counter 50 for supplying the column addresses Y0-Y8 delivered from column address buffer 40 and supplying to each memory bank 10; bank selection buffer 60 for decoding bank selection signals BA0 and BA1 and activating the selected memory bank 10; mode register 70 for holding operation mode information such as known CAS latency, burst length, burst type, and test mode; antifuse block 80 that is used for remedying memory cell defects; output buffer 90 for temporarily holding data that are to be delivered from the DQ terminal; input buffer 100 for temporarily holding data that are received as input from the DQ terminal; and control circuit 110 for controlling the overall operation of the semiconductor memory device. In FIG. 1, an example of the configuration is shown in which the semiconductor memory device has four banks (Banks 0-3) $10_1$-$10_4$, but the number of memory banks 10 is not limited to four and can be any number. In addition, although an example is shown in FIG. 1 in which address signals A0-A15 are 16 bits, these signals need not be 16 bits and can be of any number. In the explanation of the present embodiment, the semiconductor memory device is assumed to be DRAM (Dynamic RAM), but the present invention can be applied to any type of semiconductor memory device that is of a configuration in which defects in memory cells can be remedied through the use of antifuses, including SRAM (Static RAM) or ROM.

Row addresses X0-X12 that are delivered from row address buffer 30 shown in FIG. 1 and column addresses Y0-Y8 that are delivered from column address counter 50 are supplied to row decoders and column decoders that are provided in memory banks 101-104. Row addresses X0-X12 and column addresses Y0-Y8 are decoded by row decoders and column decoders, and the data writing/reading is executed with respect to the memory cells that are the object of access indicated by the results of decoding.

Each memory bank 10 is connected to input buffer 100 and output buffer 90 by way of read/write bus (RW-BUS) 120. Data that are received as input from the DQ terminal (provided in, for example, 16-bit portions) are supplied to memory bank 10 that is the access destination by way of input buffer 100 and read/write bus 120, and are written to the memory cell that is designated by the address signal by the main amplifier that is provided corresponding to each memory bank 10. In addition, data that are stored in memory cells that are designated by address signals are read by a main amplifier and supplied from the DQ terminal by way of read/write bus 120 and output buffer 90.

Refresh counter 130 shown in FIG. 1 is a timing generation circuit for controlling a known refresh operation that is necessary when the semiconductor memory device is DRAM. DQS buffer 140 is a buffer circuit for holding known DQ strobe signals, and DLL circuit 150 is a circuit for delaying DQ strobe signals according to the timing of transmission and reception of data. These circuits are not related to the present invention and detailed explanation is therefore here omitted.

Column address counter 50 is a circuit required for burst operations for reading/writing a plurality of items of data to a semiconductor memory device at once or for reading/writing a plurality of items of data by interleaving, but as these points are not related to the present invention, detailed explanation is here omitted.

The semiconductor memory device shown in FIG. 1 is of a configuration that assumes access to four continuous (contiguous) address units, and column addresses Y2-Y8 that exclude the least significant two bits are therefore supplied to antifuse blocks 80.

Mode register 70 holds the information indicating various operation modes generated by control circuit 110 in accordance with the set of values of /RAS (Row Address Strobe command), /CAS (Column Address Strobe command), /WE (Write Enable), /CKE (Clock Enable), /CS (Chip Select), A0-A15, BA0, and BA1 that are received as input from the outside input terminal. In addition, based on MRS (Mode Register Set) signals that are delivered from control circuit 110 during the test mode, mode register 70 supplies as output: initializing signal INT_B for setting antifuse block 80 in the initial state; test mode signal TOF for enabling acceptance of overflow signal OVERFLOW by output buffer 90; and programming mode flag TAF_PGM indicating the programming state of antifuses.

During the test mode in the semiconductor memory device shown in FIG. 1, the occurrence of defects in all memory cells is detected by comparing data that have been read with data that have been written in advance in units of 16×4=64 bits. The results of detection of defects are summarized for each memory bank 10, and supplied as bank error detection signals ERR0-3 corresponding to memory banks $10_1$-$10_4$. The address signals of the objects of access when reading data from memory cells are sequentially supplied to antifuse block 80, and upon detection of error detection signal ERROR, which is the logical sum (OR) of each bank error detection signal ERR0-3, the address signal of the corresponding object of access is held in the address register.

Antifuse block 80 encodes bank error detection signals ERR0-3 to identify memory bank 10 in which a defect is detected.

When remedying defects, antifuse block 80 further compares the fail addresses that are stored in antifuses with address signals that are received as input from the outside (column addresses Y2-Y8, bank selection signals BA0 and BA1, and row addresses X0-X12 that are supplied from address buffer 20) in bit units, and when the addresses match, antifuse block 80 supplies bank fuse hit signals AF0HIT-AF3HIT that indicate access to defect memory cells. Any one of bank fuse hit signals AF0HIT-AF3HIT is supplied as output corresponding to memory bank 10 that is the object of access. Antifuse block 80 further supplies antifuse hit signal AFHIT_B, which is the OR result of bank fuse hit signals AF0HIT-AF3HIT, to each memory bank 10.

As described above, during writing of fail addresses in the address register in the semiconductor memory device of the present embodiment, overflow signal OVERFLOW is supplied from antifuse block 80 when writing of a number of fail addresses that is greater than the number of antifuses that are provided in antifuse block 80 is about to be executed. Alternatively, during programming of antifuses, when a number of programming is about to be executed that is greater than the number of instances of programming to all antifuses, overflow signal OVERFLOW is supplied from antifuse block 80.

As shown in FIG. 2, output buffer 90 is provided with selection circuit 91 and buffer circuit 92, and delivers either of data that are supplied by way of read/write bus (RW-BUS) 120 or overflow signal OVERFLOW that is supplied from antifuse block 80 in accordance with test mode signal TOF that is supplied from mode register 70. Output buffer 90 shown in FIG. 2 need not be provided corresponding to all DQ terminals and may be provided only at any one DQ terminal. Buffer circuit 92 (see FIG. 2) alone may be provided at DQ terminal that does not deliver overflow signal OVERFLOW.

Explanation next regards the configuration of antifuse block 80 shown in FIG. 1 with reference to FIGS. 3-7.

As shown in FIG. 3, antifuse block 80 is of a configuration that includes: fuse block 81 that is provided with a plurality of antifuses and a plurality of corresponding address registers; AF bank encoder 82 for generating encoding signals BA0 and BA1 for specifying memory banks 10 in which defects have been detected, and error signal ERROR, which is the OR result of bank error detection signals ERR0-3, these signals being used during writing to address registers and during programming of antifuses; AF selection circuit 83 for supplying antifuse selection signals AFNSEL and AF0SEL-AF3SEL for selecting antifuses for storing fail addresses and overflow signal OVERFLOW for indicating that all antifuses have been used; programming mode counter 84 for generating timing signals used during programming of antifuses; comparison circuit 85 for detecting matching or nonmatching between fail addresses that are held in antifuses and address signals that are received as input from the outside; and reference level generation circuit 86 for generating the reference voltage Ref that is used for reading fail addresses that are stored in antifuses.

Figure 4:
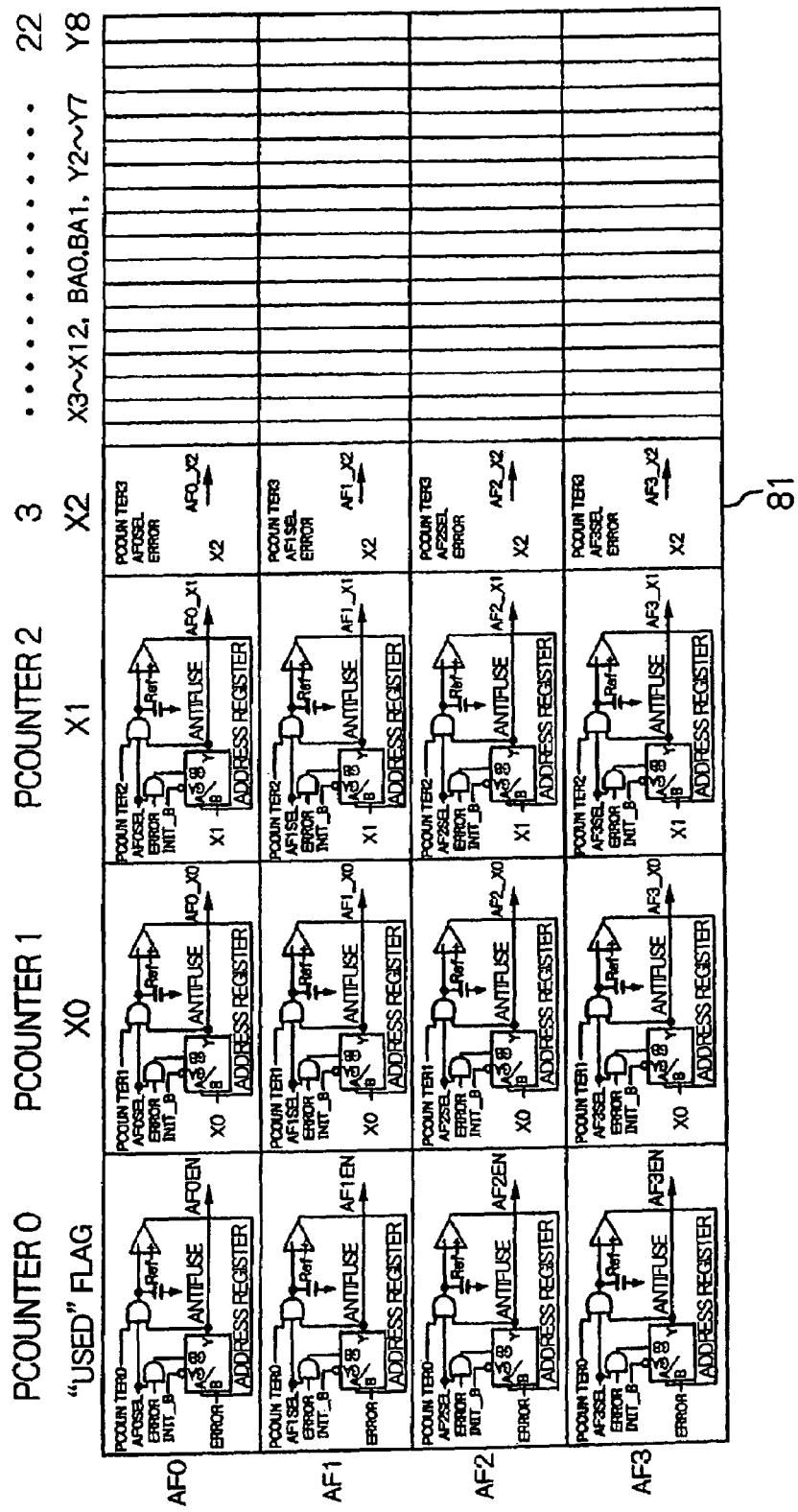
FIG. 4 is a circuit diagram showing an example of the configuration of the fuse block shown in FIG. 3.

As shown in FIG. 4, fuse block 81 is, for example, of a configuration that is provided with four antifuse sets (AF0-3) each corresponding to a memory bank 10.

Antifuse sets AF0-3 are each provided with blocks that are provided with an antifuse, an address register, two AND circuits, and a comparator; these blocks being provided for each of row addresses X0-X12, column addresses Y2-Y8, bank selection signals BA0 and BA1, and for generating "antifuse-used" flags AF0EN-AF3EN. Accordingly, the example shown in FIG. 4 has: the number of address bits (23)×the number of sets (4)=92 blocks that include antifuses and address registers.

Figure 5:
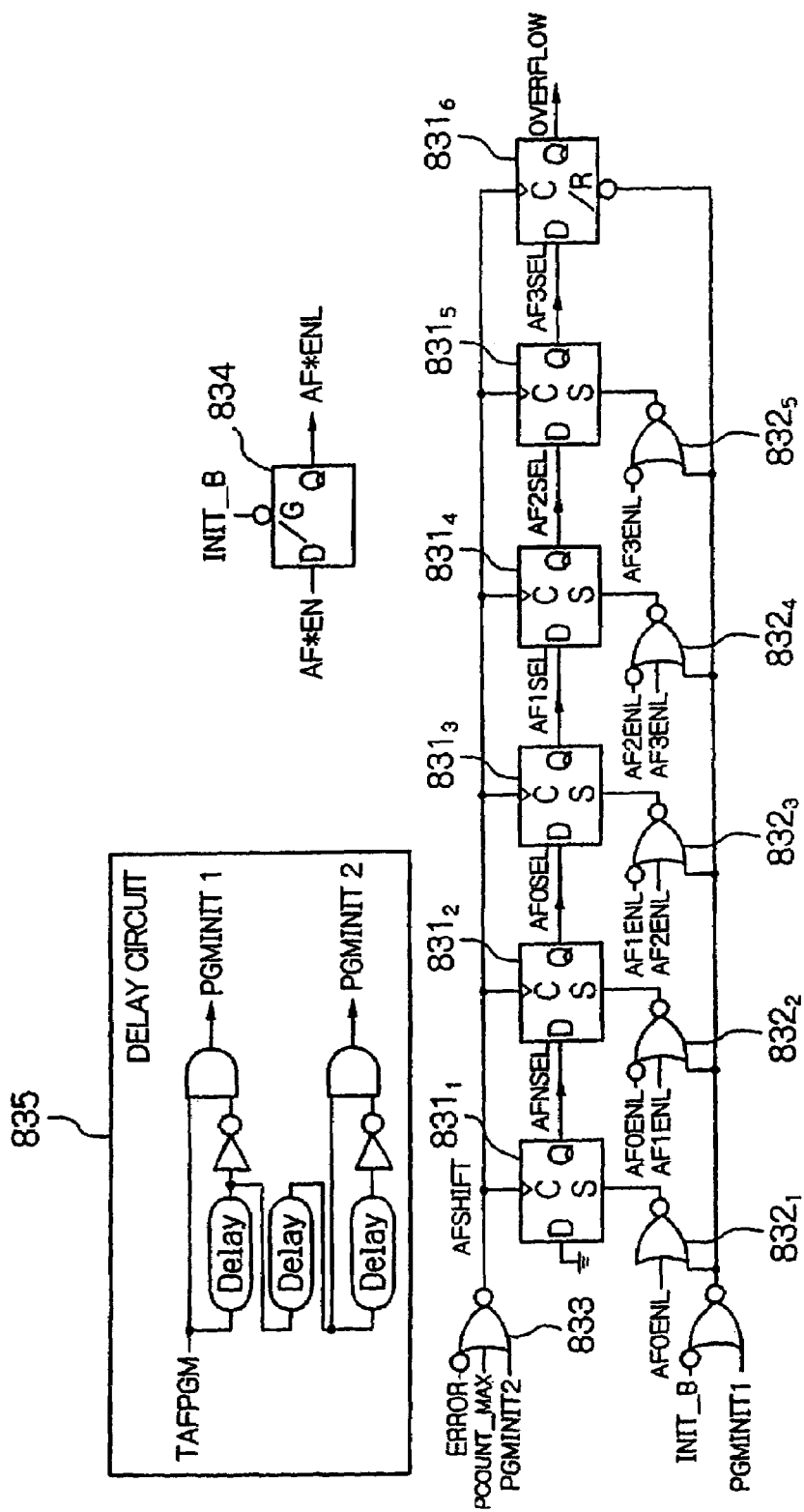
FIG. 5 is a circuit diagram showing an example of the configuration of the AF selection circuit shown in FIG. 3.

As shown in FIG. 5, AF selection circuit 83 is of a configuration that includes: a plurality of flip-flops 831 ($831_1$-$831_6$ in FIG. 5) that are connected in a series, each generating antifuse selection signals AFNSEL, AF0SEL-AF3SEL; a plurality of OR circuits 832 ($832_1$-$832_5$ in FIG. 5) for setting the values of each flip-flop 831 based on flags AF0ENL-AF3ENL indicating that antifuses have been used; and OR circuit 833 for generating select fuse signal AFSHIFT for causing the shift operation of each of flip-flops 831 based on either error detection signal ERROR or count signal PCOUNT_MAX that indicates the end of programming of one antifuse set and that is supplied from programming mode counter.

AF selection circuit 83 is further provided with: gate circuit 834 for generating each of AF0ENL-AF3ENL based on "antifuse-used" flags AF0EN-AF3EN, AF0ENL-AF3ENL being the inverted signals of AF0EN-AF3EN, at the timing of initializing signal INT_B; and delay circuit 835 for generating each of first initial setting signal PGMINIT1 that is obtained by delaying programming mode flag TAF PGM that is supplied from mode register 70 and second initial setting signal PGMINIT 2 that is obtained by further delaying first initial setting signal PGMINIT1.

OR circuit 832 supplies a significant value to set input terminal S of flip-flops 831 that corresponds to the antifuse set that is to be selected next when "used" flags AF0ENL-AF3ENL attain a significant value. In the event of a significant value of not only the count signal PCOUNT_MAX of programming mode counter 84 or error detection signal ERROR but also first initial setting signal PGMINIT1, each flip-flop 831 sequentially supplies antifuse selection signals AF0SEL-AF3SEL for selecting the antifuse set that is to be used next.

Figure 6:
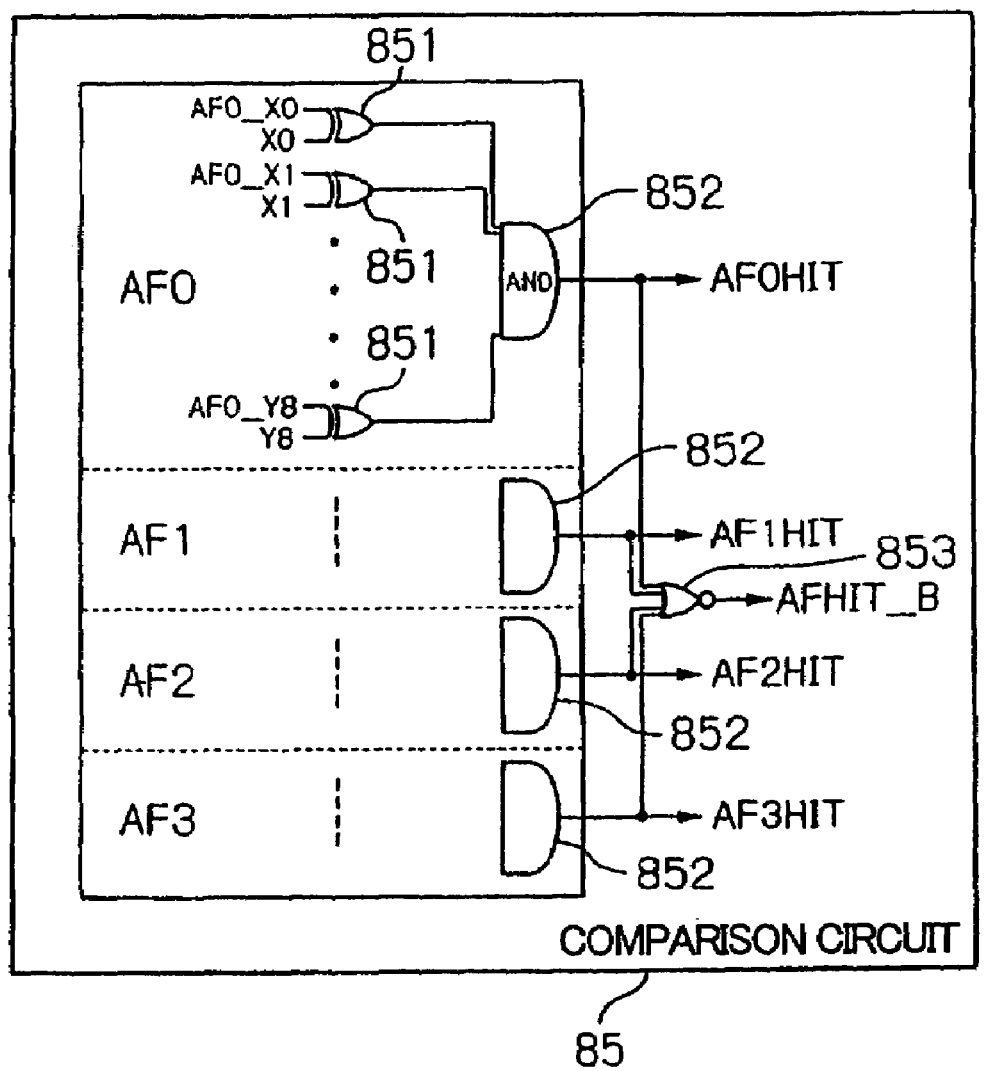
FIG. 6 is a circuit diagram showing an example of the configuration of the comparison circuit shown in FIG. 3.

As shown in FIG. 6, comparison circuit 85 is of a configuration that includes: a plurality of EXCLUSIVE-OR circuits 851 for detecting, in bit units, matching/non-matching between fail addresses AF0_X0-AF0_Y8, AF1_X0-

AF1_Y8, AF2_X0-AF2_Y8, and AF3_X0-AF3-Y8 that are stored in each of antifuse sets AF0-3 and address signals that are received as input from the outside (row addresses X0-X12, bank selection signals BA0 and BA1, and column addresses Y2-Y8 that are supplied from address buffer 20); a plurality of AND circuits 852 for aggregating detection results of EXCLUSIVE-OR circuits 851 for each memory bank 10 and supplying the result as bank fuse hit signals AF0HIT-AF3HIT; and OR circuit 853 for aggregating bank fuse hit signals AF0HIT-AF3HIT and supplying the result as antifuse hit signal AFHIT_B.

Further, as shown in FIG. 7, programming mode counter 84 is provided with a counter circuit for generating pulse signals PCOUNTER0-22 that are used during programming of antifuses and count signal PCOUNT_MAX synchronized to test clock ODT supplied from the outside.

The address registers that are equipped in antifuse sets AF0-3 shown in FIG. 4 operate as selectors for delivering either one of signals supplied to input terminals A and B from output terminal Y in accordance with the input values of control terminals /GA and GB. In addition, address registers that are equipped in antifuse sets AF0-3 shown in FIG. 4 operate as latch circuits for holding output signals.

More specifically, each address register delivers the signal received from input terminal A from output terminal Y when control terminal/GA is "low", and delivers the signal received from input terminal B from output terminal Y when control terminal GB is "High". On the other hand, each address register holds and delivers the signal received from input terminal A when control terminal /GA is "High" and holds and delivers the signal received from input terminal B when control terminal GB is "Low". However, when these operations overlap, each address register sets the output signal according to the last input value of control terminals/GA and GB.

When writing to address registers, row addresses X0-X12, bank selection signals BA0 and BA1, and column addresses Y2-Y8 are sequentially set by address signals that are supplied from the outside and all bits of memory cell arrays 10 are scanned.

At this time, when a defect is detected in any memory cell, error signal ERROR is delivered from AF bank encoder 82 and an antifuse selection signal (any one of AF0SEL-AF3SEL) for selecting the next antifuse set is delivered from AF selection circuit 83 according to the settings of "used" flags AF0ENL-AF3ENL. The antifuse selection signals AF0SEL-AF3SEL that correspond to the selected antifuse sets are set to "High", and the values of row addresses X0-X12, bank selection signals BA0 and BA1, and column addresses Y2-Y8 are delivered from the output terminals Y of each address register. When the next antifuse selection signal is set to "High", the previous antifuse selection signal switches to "Low", and the values of row addresses X0-X12, bank selection signals BA0 and BA1, and column addresses Y2-Y8 that have been received as input are each held by the address register. In other words, when antifuse selection signal AF(n+1)SEL (n=0-3) becomes "High", antifuse selection signal AF(n)SEL becomes "Low" and address signals (fail addresses) that have been applied as input to the corresponding antifuse set are held in each address register.

At the same time, the address register holds error signal ERROR that has been received as input from the address register for "used" flags of the corresponding antifuse set and supplies the error signal ERROR as a "used" flag (any one of AF0EN-AF3EN).

During programming of antifuses, pulse signals PCOUNTER0-22 that are supplied from the programming mode counter are sequentially supplied to each antifuse set and pulses are applied to each antifuse to program antifuses in accordance with the fail addresses that are stored in address registers. In antifuse sets for which programming is completed, the input voltages of comparators are set in accordance with the state of the antifuses (short-circuited or open), and the difference between the input voltage and the reference voltage Ref is amplified by the comparators and supplied to input terminal A of the address registers. When initializing signal INT_B is then received as input, the input signal to input terminal A of address register is selected and delivered, following which the output voltage of the comparator is held by the address register as the fail address.

Comparison circuit 85 compares each of the outputs of each antifuse set AF0_X0-AF0_Y8, AF1_X0-AF1_Y8, AF2_X0-AF2_Y8, and AF3_X0-AF3_Y8 address signals that are received as input from the outside (row addresses X0-X12, bank selection signals BA0 and BA1, and column addresses Y2-Y8 that are delivered from the address buffer) in an EXCLUSIVE-OR circuit, and when a match occurs between the output of the antifuse set and an address signal, supplies the corresponding bank fuse hit signal AF0HIT-AF3HIT.

In addition, when any one of bank fuse hit signals AF0HIT-AF3HIT attains a significant value, antifuse hit signal AFHIT_B is supplied as output by an OR circuit.

The operation when writing fail addresses to address registers and the operation when programming antifuses of the semiconductor memory device of the present invention are next explained for specific examples using FIGS. 8-11.

FIGS. 8 and 9 show only the operation when defects are detected in any memory cell by means of the process of reading data during the test mode. To actually read data, the operation of writing of data to each memory cell and the operation of precharging each memory cell must be carried out before reading data.

Explanation first regards the operation of writing a fail address to an address register using FIGS. 8 and 9.

As shown in FIGS. 8 and 9, when an MRS signal is supplied as output from the control circuit due to various control signals such as /RAS, /CAS, /WE, CKE, /CS, A0-A5, BA0 and BA1 that are received as input from the outside, an initializing signal INT_B is supplied from mode register 70, and antifuse block 80 is set to the initial state.

At this time, "used" flags are supplied from antifuse sets that have already been programmed and corresponding flip-flops 831 of AF selection circuit 83 are set. For example, as shown in FIG. 8, when there is no antifuse set that has been used, antifuse selection signal AFNSEL that indicates this state is "High". When there are two used antifuse sets (AF0 and AF1 have been used) as shown in FIG. 9, antifuse selection signal AF1SEL that indicates this state is "High".

When the semiconductor memory device is set to test mode by a control signal that is received as input from the outside, test mode signal TOF is supplied from mode register 70, and output buffer 90 is able to accept overflow signal OVERFLOW that is supplied from antifuse block 80.

When a READ command of data is subsequently issued due to a control signal that is received as input from the outside, data are sequentially read from each memory bank in accordance with the address signal that is received as input together with the READ command. At this time, if a defect (Fail) is detected in any memory bank, a bank error detection signal ERR0-3 is supplied to the antifuse block and an error detection signal ERROR is supplied by AF bank encoder 82.

AF selection circuit 83, having received the error detection signal ERROR, causes flip-flop 831 to operate by means of select fuse shift signal AFSHIFT and supplies fuse selection signal AF(n+1)SEL(n=0-3) for selecting the next antifuse set that has not been set to "used".

In the example shown in FIG. 8, none of antifuse sets AF0-3 has been used, and select fuse shift signal AFSHIFT that is supplied with each detection of a defect (Fail) in any memory bank cause fuse selection signal AF0SEL, AF1SEL, AF2SEL, and AF3SEL to be successively switched to "High", following which overflow signal OVERFLOW is supplied upon the detection of yet another defect (Fail).

At this time, the fail addresses are written to each address register of antifuse sets AF0-3 at the timing of change of fuse selection signals AF0SEL, AF1SEL, AF2SEL, and AF3SEL from "High" to "Low". In addition, in blocks for the "used" flags of antifuse sets AF0-AF3, "used" flags are written to the address register at the timing that fuse selection signals AF0SEL, AF1SEL, AF2SEL, and AF3SEL change from "High".

In the example shown in FIG. 9, antifuse sets AF0 and AF1 have been used, and the select fuse shift signal AFSHIFT that is supplied with each detection of a defect (Fail) in any memory bank causes fuse selection signals AF2SEL and AF3SEL to sequentially switch to "High", following which the overflow signal OVERFLOW is supplied upon detection of yet another defect (Fail).

At this time, fail addresses are written to each of the address register of antifuse sets AF2 and AF3 at the timing of change of fuse selection signals AF2SEL and AF3SEL from "High" to "Low". In addition, "used" flags are written in the blocks for "used" flags of antifuse sets AF2 and AF3 at the timing that fuse selection signals AF2SEL and AF3SEL change from "High" to "Low".

Figure 11:
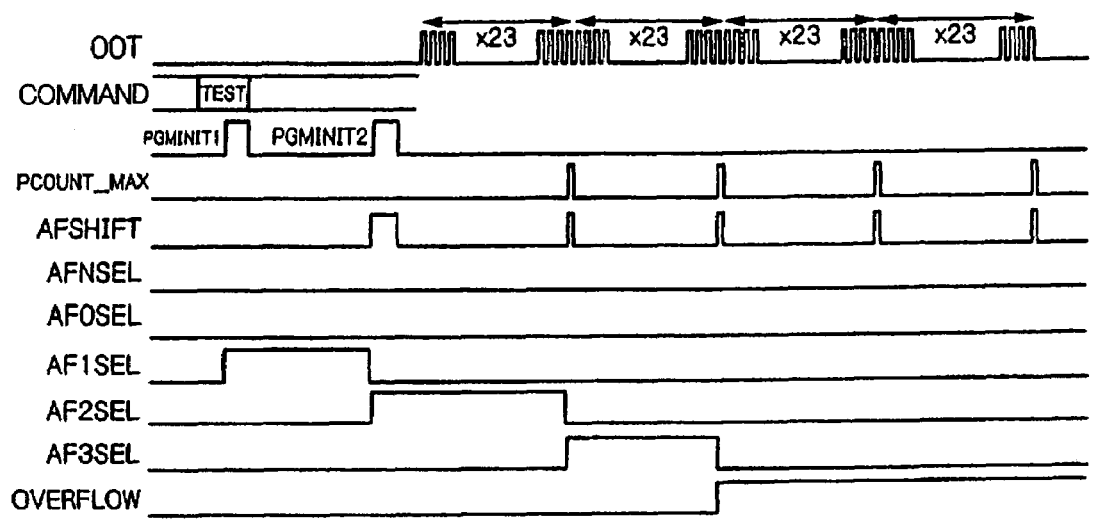
FIG. 11 is a timing chart showing the operation during programming of antifuses when there are two sets of used antifuses.

Explanation next regards the operation during programming of antifuses using FIGS. 10 and 11.

As shown in FIGS. 10 and 11, when the semiconductor memory device is set to the test mode (programming mode) by various control signals such as /RAS, /CAS, /WE, CKE, /CS, A0-A15, BA0 and BA1 that are received as input from the outside, test mode signal TOF is supplied from mode register 70, and output buffer 90 enters a state that allows acceptance of the overflow signal OVERFLOW that is supplied from antifuse block 80.

Programming mode flag TAF_PGM is supplied from mode register 70, first initial setting signal PGMINIT 1 is delivered from delay circuit 835 of AF selection circuit 83, and each flip-flop 831 of AF selection circuit 83 is set to the initial state. At this time, "used" flags are supplied from the already programmed antifuse sets and corresponding flip-flops 831 of AF selection circuit 83 are set. As shown in FIG. 10, for example, when there are no antifuse sets that have been used, antifuse selection signal AFNSEL that indicates this state becomes "High", and when two antifuse sets have been used (AF0 and AF1 have been used), as shown in FIG. 11, antifuse selection signal AF1SEL that indicates this state becomes "High".

Next, when second initial setting signal PGMINIT2 from delay circuit 835 of AF selection circuit 83 is supplied, the count operation by programming mode counter 84 begins in synchronization with test clock ODT that is supplied from the outside. At this time, PCOUNT_MAX is supplied from programming mode counter 84 for each 23 pulses of test clock ODT and select fuse shift signals AFSHIFT are supplied in synchronization.

AF selection circuit 83 shifts output signal of flip-flops 831 at the timing of select fuse shift signal AFSHIFT and supplies fuse selection signals AF(n+1)SEL (n=0-3) for selecting antifuse sets.

Because none of antifuse sets AF0-AF3 has been programmed in the example that is shown in FIG. 10, fuse selection signals AF0SEL, AF1SEL, AF2SEL, and AF3SEL are successively switch to "High" for each timing of PCOUNT_MAX that is supplied from programming mode counter 84, and when still further programming is attempted, the overflow signal OVERFLOW is delivered as output.

At this time, pulse signals PCOUNTER0-22 that are supplied from programming mode counter 84 are applied to each antifuse of antifuse sets AF0-AF3 according to the fail addresses that are held in the corresponding address register to write the fail addresses.

In the example that is shown in FIG. 11, because antifuse sets AF0 and AF1 have already been programmed, fuse selection signals AF2SEL and AF3SEL are successively switched to "High" for each timing of PCOUNT_MAX that is supplied from programming mode counter 84, and the overflow signal OVERFLOW is supplied if further programming is attempted.

At this time, pulse signals PCOUNTER0-22 are supplied from programming mode counter 84 to each antifuse of antifuse sets AF2 and AF3 according to the fail addresses that are held in the corresponding address registers, whereby the fail addresses are written.

As previously explained, during writing of fail addresses to address registers that are provided in antifuse block 80 according to the semiconductor memory device of the present invention, when writing of a number of fail addresses that is greater than the number of antifuses that have been provided in advance is to be executed, or when a process is to be executed for storing a number of fail addresses that is greater than the number of antifuses that have been provided in advance, an overflow signal indicating that the operation cannot be executed is supplied. As a result, the point at which defects can no longer be remedied by using antifuses can be easily verified from the outside by simply monitoring overflow signals. Accordingly, a test can be terminated at the time at which an overflow signal is detected and the step for using antifuses to remedy defects as well as the time required for this test step can be shortened.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device comprising:
   a plurality of antifuses, which are nonvolatile memory elements in which are stored fail addresses, said fail addresses being the addresses of memory cells in which defects have been detected;
   a plurality of address registers provided to correspond to each of said antifuses for temporarily holding said fail addresses that are to be stored in said antifuses; and
   an AF selection circuit for, during writing said fail addresses to said address registers, when writing of a number of said fail addresses that is greater than the number of said antifuses that have been provided in advance is to be executed, delivering as output an overflow signal indicating that the write operation cannot be executed.

2. The semiconductor memory device according to claim 1, wherein:

"used" flags indicating that said fail addresses have already been stored in said antifuses are stored in said antifuses; and based on said "used" flags, said AF selection circuit generates selection signals for selecting still unused antifuses and address registers as the storage destination of the fail address of a memory cell in which a defect is next detected.

3. The semiconductor memory device according to claim 1, further including an output buffer for, during normal operation, supplying data that are read from said memory cells to the outside from a DQ terminal, which is the external input/output terminal of said data; and during testing of the semiconductor memory device, supplying said overflow signal to the outside from said DQ terminal.

4. A semiconductor memory device comprising:

a plurality of antifuses, which are nonvolatile memory elements in which are stored fail addresses, these fail addresses being addresses of memory cells in which defects have been detected;

a plurality of address registers provided to correspond to each of said antifuses for temporarily holding said fail addresses that are to be stored in said antifuses; and an AF selection circuit for, during storage of said fail address in said antifuses, when a storage process of a number of said fail addresses that is greater than the number of said antifuses that have been provided in advance is to be executed, delivering as output an overflow signal indicating that the storage operation cannot be executed.

5. The semiconductor memory device according to claim 4, wherein:

"used" flags indicating that said fail addresses have already been stored in said antifuses are stored in said antifuses; and based on said "used" flags, said AF selection circuit generates selection signals for selecting still unused antifuses and address registers as the storage destination of the fail address of a memory cell in which a defect is next detected.

6. The semiconductor memory device according to claim 4, further including an output buffer for, during normal operation, supplying data that are read from said memory cells to the outside from a DQ terminal, which is the external input/output terminal of said data; and during testing of the semiconductor memory device, supplying said overflow signal to the outside from said DQ terminal.

7. A semiconductor memory device test method for testing a semiconductor memory device, said semiconductor memory device including:

a plurality of antifuses, which are nonvolatile memory elements in which are stored fail addresses, said fail addresses being the addresses of memory cells in which defects have been detected; and a plurality of address registers provided to correspond to each of said antifuses for temporarily holding said fail addresses that are to be stored in said antifuses;

said test method comprising the steps of:

causing output of an overflow signal from said semiconductor memory device when, during writing of said fail addresses to said address registers, writing of a number of said fail addresses that is greater than the number of said antifuses that have been provided in advance is to be executed, said overflow signal indicating that the writing cannot be executed; and terminating a test upon detecting said overflow signal.

8. The semiconductor memory device test method according to claim 7, wherein:

"used" flags indicating that said fail address have already been stored in said antifuses are stored in said antifuses; and based on said "used" flags, selecting still unused antifuses and address registers as the storage destination of fail addresses of memory cells in which defects are next detected.

9. The semiconductor memory device test method according to claim 7, wherein said overflow signal is supplied to the outside from a DQ terminal, which is an external input/output terminal for data.

10. A semiconductor memory device test method for testing a semiconductor memory device, said semiconductor memory device including:

a plurality of antifuses, which are nonvolatile memory elements in which are stored fail addresses, said fail addresses being the addresses of memory cells in which defects have been detected; and a plurality of address registers provided to correspond to each of said antifuses for temporarily holding said fail addresses that are to be stored in said antifuses;

said test method comprising the steps of:

causing output of an overflow signal from said semiconductor memory device when, during storage of said fail addresses to said antifuses, a storage process of a number of said fail addresses that is greater than the number of said antifuses that have been provided in advance is to be executed, said overflow signal indicating that the storage process cannot be executed; and terminating a test upon detecting said overflow signal.

11. The semiconductor memory device test method according to claim 10, wherein:

"used" flags indicating that said fail address have already been stored in said antifuses are stored in said antifuses; and based on said "used" flags, selecting still unused antifuses and address registers as the storage destination of fail addresses of memory cells in which defects are next detected.

12. The semiconductor memory device test method according to claim 10, wherein said overflow signal is supplied to the outside from a DQ terminal, which is an external input/output terminal for data.

* * * * *